(12) United States Patent
Tanaka et al.

(10) Patent No.: US 10,880,989 B2
(45) Date of Patent: Dec. 29, 2020

(54) ELECTRICAL JUNCTION BOX

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Yasufumi Tanaka, Mie (JP); Yukinori Kita, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/494,806

(22) PCT Filed: Mar. 20, 2018

(86) PCT No.: PCT/JP2018/011004
§ 371 (c)(1),
(2) Date: Sep. 17, 2019

(87) PCT Pub. No.: WO2018/174052
PCT Pub. Date: Sep. 27, 2018

(65) Prior Publication Data
US 2020/0100353 A1    Mar. 26, 2020

(30) Foreign Application Priority Data

Mar. 24, 2017  (JP) .................. 2017-058818

(51) Int. Cl.
*H05K 1/02*   (2006.01)
*H05K 5/00*   (2006.01)
*H05K 5/04*   (2006.01)

(52) U.S. Cl.
CPC ........... *H05K 1/021* (2013.01); *H05K 5/0043* (2013.01); *H05K 5/04* (2013.01)

(58) Field of Classification Search
CPC ........ H05K 1/021; H05K 5/0043; H05K 5/04; H05K 7/20445; H05K 7/20472;
(Continued)

(56) References Cited

U.S. PATENT DOCUMENTS 4,597,617 A * 7/1986 Enochs ................. H05K 3/325
                                                361/749
5,208,732 A * 5/1993 Baudouin ............ G06K 19/077
                                                257/713

(Continued)

FOREIGN PATENT DOCUMENTS

JP   H4-245499 A   9/1992
JP   H11-163566 A  6/1999
(Continued)

OTHER PUBLICATIONS

International Search Report, Application No. PCT/JP2018/011004, dated Jun. 5, 2018. ISA/Japan Patent Office.

*Primary Examiner* — Binh B Tran
*Assistant Examiner* — Michael A Matey
(74) *Attorney, Agent, or Firm* — Honigman LLP

(57) ABSTRACT

An electrical junction box includes: a circuit board on which an electronic component having a main body is mounted on a mounting surface; a frame inside of which the circuit board is accommodated; a cover portion covering the circuit board from the mounting surface side; and a heat transfer member disposed between the main body and the cover portion, and the frame includes a heat transfer member holding portion holding the heat transfer member at a position where the heat transfer member is in heat conductive contact with both the main body and the cover portion.

7 Claims, 3 Drawing Sheets

(58) Field of Classification Search
CPC .......... H05K 7/20518; H05K 7/20845–20854;
H05K 1/0201–0203
See application file for complete search history.

(56) References Cited

U.S. PATENT DOCUMENTS

| | | | | |
|---|---|---|---|---|
| 5,408,190 | A * | 4/1995 | Wood | G01R 1/0466 257/E21.525 |
| 5,648,893 | A * | 7/1997 | Loo | H01L 23/4006 257/727 |
| 5,754,402 | A * | 5/1998 | Matsuzaki | H01L 23/36 361/707 |
| 5,812,375 | A * | 9/1998 | Casperson | H05K 1/0204 165/80.3 |
| 7,345,885 | B2 * | 3/2008 | Boudreaux | H05K 1/144 165/185 |
| 7,518,882 | B2 * | 4/2009 | Shimizu | H05K 1/0263 174/262 |
| 9,456,510 | B2 * | 9/2016 | Hattori | H05K 5/0065 |
| 2002/0185294 | A1 * | 12/2002 | Shlyakhtichman | H05K 9/0032 174/384 |
| 2004/0160754 | A1 * | 8/2004 | Kobayashi | H05K 1/0203 361/783 |
| 2010/0277868 | A1 * | 11/2010 | Beaupre | H01L 23/473 361/700 |
| 2011/0013368 | A1 * | 1/2011 | Nagaike | H05K 9/0032 361/728 |
| 2011/0013370 | A1 * | 1/2011 | Oota | H01L 23/42 361/752 |
| 2013/0003306 | A1 * | 1/2013 | Oota | B60R 16/0239 361/709 |
| 2013/0119908 | A1 * | 5/2013 | Harada | H02P 6/10 318/400.42 |
| 2014/0002989 | A1 * | 1/2014 | Ahuja | G06F 1/20 361/679.54 |
| 2014/0048326 | A1 * | 2/2014 | Lin | H05K 9/00 174/377 |
| 2015/0048675 | A1 * | 2/2015 | Fujii | B60L 50/51 307/10.1 |
| 2015/0245543 | A1 * | 8/2015 | Jang | H05K 9/0032 361/760 |
| 2017/0367175 | A1 * | 12/2017 | Lai | H05K 7/20445 |
| 2018/0228047 | A1 * | 8/2018 | Ota | H01R 13/6658 |
| 2019/0067925 | A1 * | 2/2019 | Tsuchida | H02G 3/16 |
| 2019/0319440 | A1 * | 10/2019 | Haraguchi | H03K 17/687 |
| 2020/0068700 | A1 * | 2/2020 | Ma | H05K 1/0206 |
| 2020/0194159 | A1 | 6/2020 | Tsuchida | H01F 27/02 |

FOREIGN PATENT DOCUMENTS

| | | |
|---|---|---|
| JP | 2002-280776 A | 9/2002 |
| JP | 2006-211776 A | 8/2006 |

* cited by examiner

ELECTRICAL JUNCTION BOX

CROSS-REFERENCE TO RELATED APPLICATIONS

This application is the U.S. national stage of PCT/JP2018/011004 filed on Mar. 20, 2018, which claims priority of Japanese Patent Application No. JP 2017-058818 filed on Mar. 24, 2017, the contents of which are incorporated herein.

TECHNICAL FIELD

The technique disclosed in the present specification relates to an electrical junction box.

BACKGROUND

As an apparatus for connecting and disconnecting an on-vehicle electrical component to/from a power source, for example, an electrical junction box has been known in which a circuit board on which various electronic components are mounted is accommodated in a case.

In such an apparatus, some electronic components mounted on the circuit board generate a relatively large amount of heat, and the heat generated from such electronic components may cause the inside of the case to have a high temperature. If the temperature in the case becomes too high, the performance of the electronic components may be degraded.

Accordingly, various configurations for dissipating heat generated from a circuit board and electronic components have been proposed. JP H11-163566A discloses, for example, a configuration in which a heat conducting component for heat dissipation is interposed between electronic components mounted on a printed circuit board and a cover, and heat is dissipated from the cover.

Among the electronic components mounted on the circuit board, there are relatively large electronic components such as a coil. Such large electronic components are more susceptible to vibration or the like than small electronic components while a vehicle is running. In addition, the heat conducting component interposed between the electronic components and the cover may also be displaced or detached from a predetermined position due to the vibration. As a result, due to the displacement of the electronic components and the heat conducting component, the heat of the electronic components cannot be efficiently conducted to the cover, and the heat dissipation of the electrical junction box may be impaired.

The technique disclosed in the present specification is completed based on the above-mentioned circumstances, and the object thereof is to provide an electrical junction box excellent in heat dissipation.

SUMMARY

The technique disclosed in the present specification is an electrical junction box including: a circuit board on which an electronic component having a main body is mounted on a mounting surface; a frame inside of which the circuit board is accommodated; a cover portion covering the circuit board from the mounting surface side; a heat transfer member disposed between the main body and the cover portion, and the frame includes a heat transfer member holding portion holding the heat transfer member at a position where the heat transfer member is in heat conductive contact with both the main body and the cover portion.

With the above configuration, the heat transfer member disposed between the main body of the electronic component and the cover portion is positioned and held within a predetermined region by the heat transfer member holding portion provided in the frame. As a result, it is possible to prevent the heat transfer member from shifting or moving out of the predetermined region due to vibration or the like of the vehicle. Therefore, the heat generated in the electronic component can be reliably dissipated from the cover portion through the heat transfer member.

The above electrical junction box may also include the following configurations.

The heat transfer member holding portion may be an opening region continuously surrounding the circumference of the heat transfer member. This configuration can prevent the heat transfer member from flowing out of the heat transfer member holding portion, even when a heat conductive adhesive, a heat conductive gel, or the like having a relatively low viscosity is used as the heat transfer member.

A configuration may also be employed in which the frame includes an electronic component holding portion holding the main body, and the heat transfer member holding portion is integrally provided with the electronic component holding portion.

With this configuration, even when the heat transfer member is provided to a relatively large electronic component susceptible to the influence of vibration, the electronic component can be prevented from shifting and moving due to the influence of vibration. In addition, the structure of the frame can be simplified as compared with a structure in which the heat transfer member holding portion and the electronic component holding portion are separately provided.

A specific configuration in which the heat transfer member holding portion and the electronic component holding portion are integrally provided includes, for example, a configuration in which a holding wall inside of which the circumference of the main body is fitted is formed in the electronic component holding portion, and the heat transfer member holding portion extends from the holding wall toward the cover portion side.

Another specific configuration in which the heat transfer member holding portion and the electronic component holding portion are integrally provided includes, for example, a configuration in which a holding wall inside of which the circumference of the main body is fitted and an edge covering portion continuously connected to the holding wall and covering the edge portion of the surface of the main body disposed on the cover portion side are formed in the electronic component holding portion, a region surrounded by the edge covering portion serving as the heat transfer member holding portion.

A configuration may also be employed in which the cover portion is provided with a contact protrusion that protrudes toward the main body and is in contact with the heat transfer member, and the contact protrusion is disposed in the heat transfer member holding portion. With this configuration, a part of the cover portion (the contact protrusion) can be reliably in contact with the heat transfer member, and the relative displacement between the contact protrusion and the heat transfer member can be reduced. Accordingly, an electrical junction box that is more excellent in heat dissipation can be obtained.

It is preferable that a heat dissipation plate is provided on the surface of the circuit board opposite to the mounting surface. Also, the frame is preferably made of metal. Furthermore, the cover portion is also preferably made of metal.

With this configuration, heat generated in the electronic component and the circuit board can be dissipated to the outside more efficiently. Accordingly, an electrical junction box with high heat dissipation effect can be obtained.

Advantageous Effects

According to the technique disclosed in the present specification, an electrical junction box excellent in heat dissipation can be obtained.

DETAILED DESCRIPTION OF PREFERRED EMBODIMENTS

One embodiment will be described with reference to FIGS. 1 to 3. An electrical junction box 10 of the present embodiment is disposed, for example, between a power supply such as a battery and an on-vehicle electrical component such as a lamp or a motor, and connects and disconnects the on-board electrical component to and from the power supply. In the following description, the upper side in FIG. 1 is the upper direction or the front side, and the lower side in FIG. 1 is the lower direction or the back side.

Figure 1:
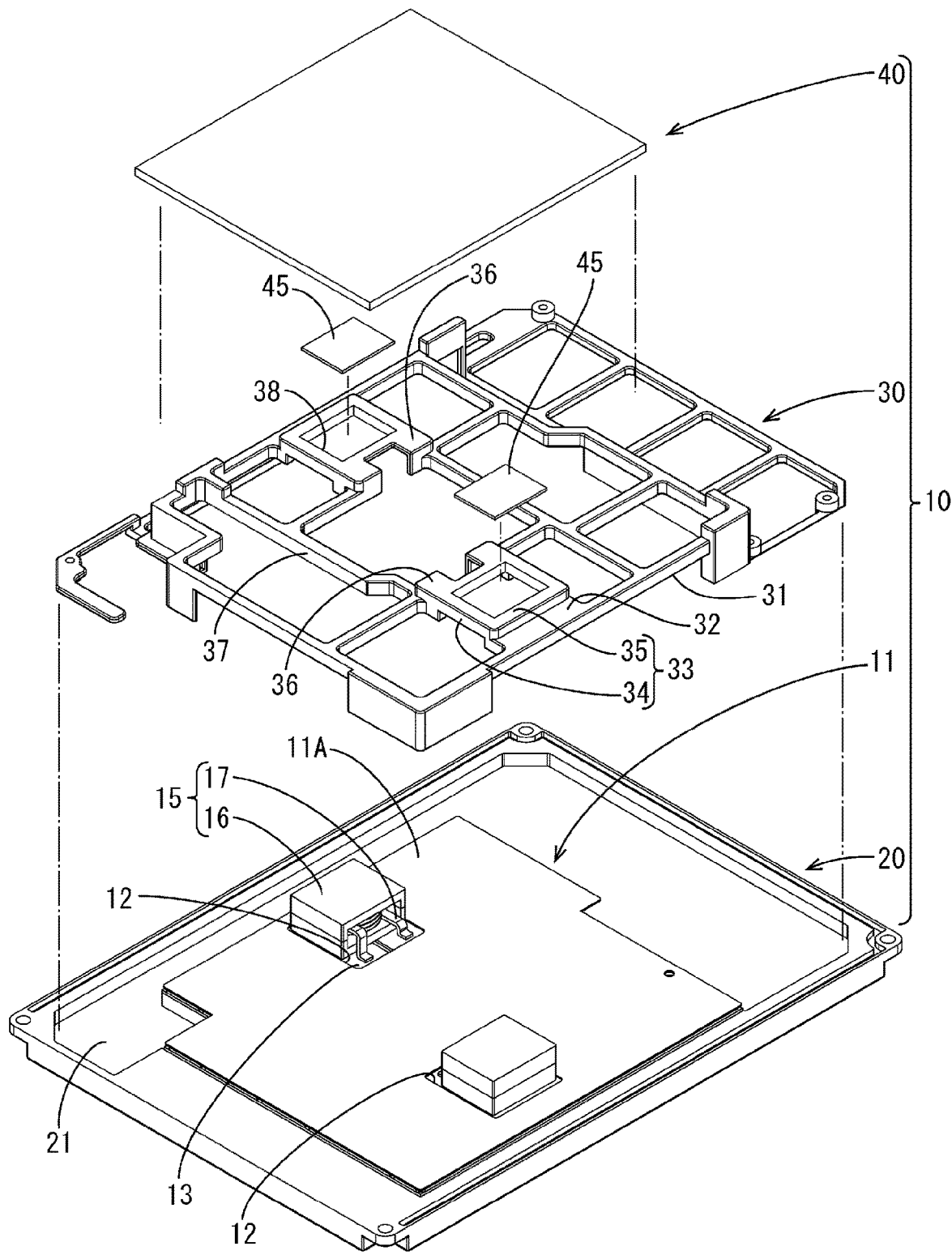
FIG. 1 is an exploded perspective view of an electrical junction box according to one embodiment.
Figure 2:
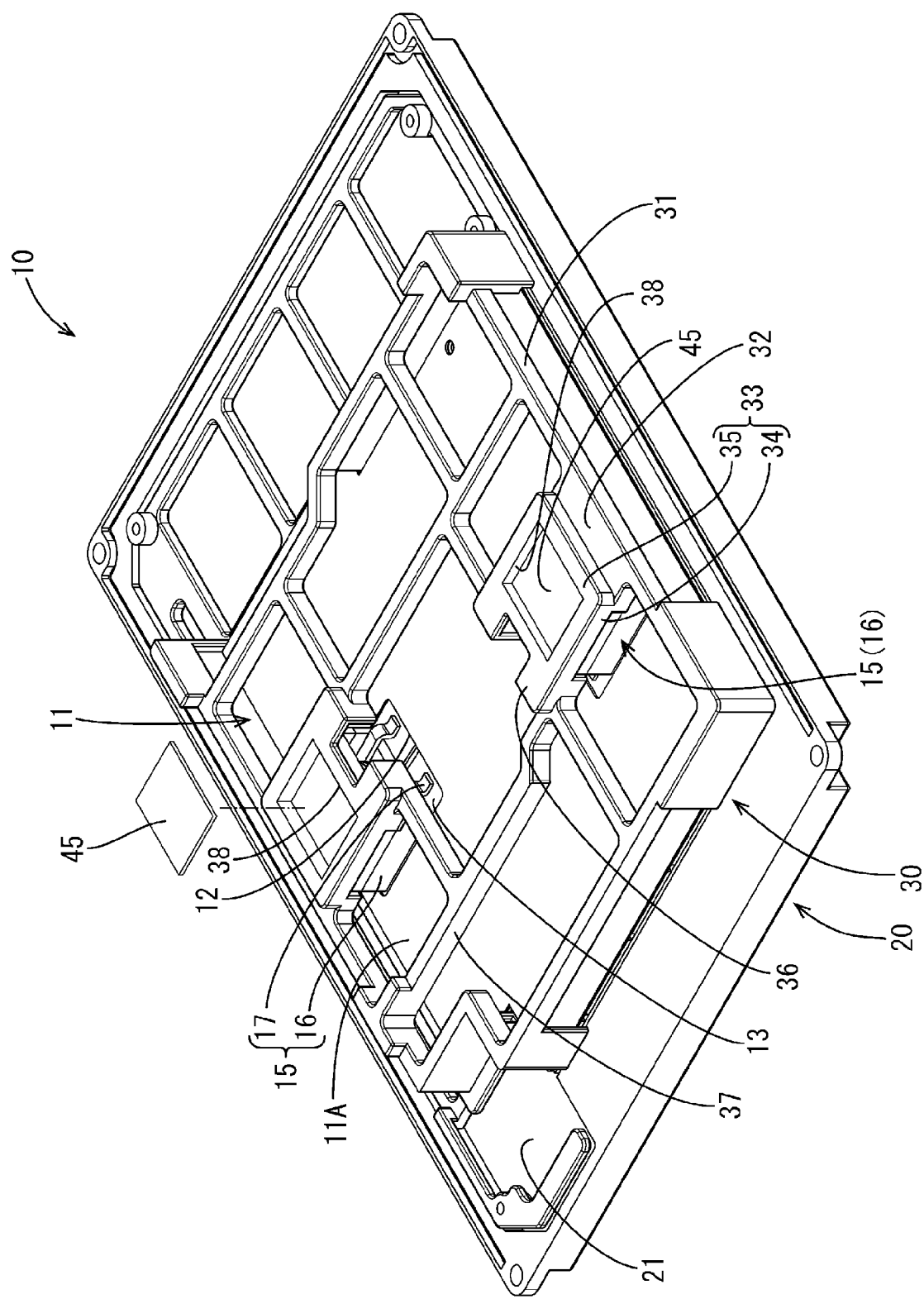
FIG. 2 is a perspective view showing a state in which a circuit board and a frame are positioned.

As shown in FIG. 1, the electrical junction box 10 includes: a circuit board 11; a heat sink 20 disposed on the back surface (the lower surface in FIG. 1) of the circuit board 11; a frame 30 for accommodating the circuit board 11 inside; and a cover portion 40 covering the circuit board 11 from the side (the upper side in FIG. 1) opposite to the heat sink 20.

Circuit Board 11

The circuit board 11 has a conductive circuit (not shown) formed on the front surface of an insulating substrate by a printed wiring technology and electronic components disposed thereon, and a plurality of bus bars 13 are wired and adhered in a predetermined pattern on the back surface. Hereinafter, the surface (the surface of the front side) of the circuit board 11 on which the electronic components are to be mounted is referred to as "mounting surface 11A".

In the present embodiment, of the plurality of electronic components, only coils 15, which are relatively large electronic components, are shown, and other electronic components are omitted. The coils 15 each have a form in which a pair of connection terminals 17 extend in parallel from the main body 16 in a direction along the circuit board 11, and are bent downward in a crank shape.

The circuit board 11 has a substantially rectangular shape, and connection openings 12 are provided at predetermined positions. Each connection opening 12 is provided to expose the bus bars 13 on the mounting surface 11A side of the circuit board 11, so that the main body 16 of the coil 15 can be placed therein and the connection terminals 17 can be connected. The pair of connection terminals 17 is connected to the front surface of the bus bar 13, which is exposed from the connection opening 12, by a known method such as soldering, for example.

Heat Sink 20

The heat sink 20 (an example of a heat dissipation plate) is disposed on the lower surface side of the circuit board 11. The heat sink 20 is a heat dissipation member made of a metal material having excellent thermal conductivity, such as aluminum or an aluminum alloy, for example, and dissipates heat generated in the circuit board 11.

The heat sink 20 is substantially plate-shaped, and the circuit board 11 is to be installed on a predetermined position on the upper surface of the heat sink 20. An insulating sheet 18 is provided between the heat sink 20 and the circuit board 11 (the bus bars 13) to achieve insulation (see FIG. 3). The insulating sheet 18 has adhesiveness and can be fixed to the bus bars 13 and the heat sink 20.

A partial area of the heat sink 20 around the area where the circuit board 11 is to be installed is a receiving recess 21 for inserting a part of the frame 30, which will be described later, and is recessed in a step-like manner from the installation area of the circuit board 11.

Frame 30

The circuit board 11 overlaid on the heat sink 20 via the insulating sheet 18 is accommodated inside the frame 30. The frame 30 is made of die-cast aluminum, and has a substantially rectangular outer frame 31 surrounding the circuit board 11, as shown in FIG. 1.

A connection portion 32 extending toward the coil 15 is provided at a position of the outer frame 31 adjacent to the coil 15. A coil holding portion 33 (an example of an electronic component holding portion) is integrally provided on the outer frame 31 via the connection portion 32. The coil holding portion 33 has a form for covering the corners of the upper end of the main body 16 of the coil 15. More specifically, as shown in FIG. 3, the coil holding portion 33 includes a substantially rectangular circumferential wall 34 (an example of a holding wall) surrounding the upper end of the main body 16 of the coil 15 and having the main body 16 fitted inside, and an edge covering portion 35 extending radially inward from the upper end of the circumferential wall 34 and covering the edge portion of the upper surface of the main body 16. The lower end of the circumferential wall 34 is connected to the connection portion 32 so that the coil holding portion 33 is disposed in a step-like manner from the end edge portion of the connection portion 32 upward.

The coil holding portion 33 is provided with a pair of terminal covering portions 36 protruding in a region corresponding to the pair of connection terminals 17 of the coil 15 to cover the connection terminals 17 from above. A bridge portion 37 is connected to a portion of the circumferential wall 34 of the coil holding portion 33, which is located on the opposite side of the connection portion 32. The bridge portion 37 directly connects the coil holding portion 33 and the outer frame 31 to each other, or indirectly connects the coil holding portion 33 and the outer frame 31 to each other via another bridge portion 37. In this manner, the coil holding portion 33 is stably disposed at a predetermined position in the outer frame 31.

The frame 30 is partially fitted into the above-mentioned receiving recess 21 of the heat sink 20. With this configuration, the frame 30 is positioned with respect to the heat sink 20.

A cover portion 40 is disposed on the upper surface of the frame 30. The cover portion 40 in the present embodiment is a top plate of the upper case (not shown) constituting a case for accommodating the circuit board 11 inside with the heat sink 20. For the sake of explanation, only a part of the cover portion 40 is shown in the figure.

Figure 3:
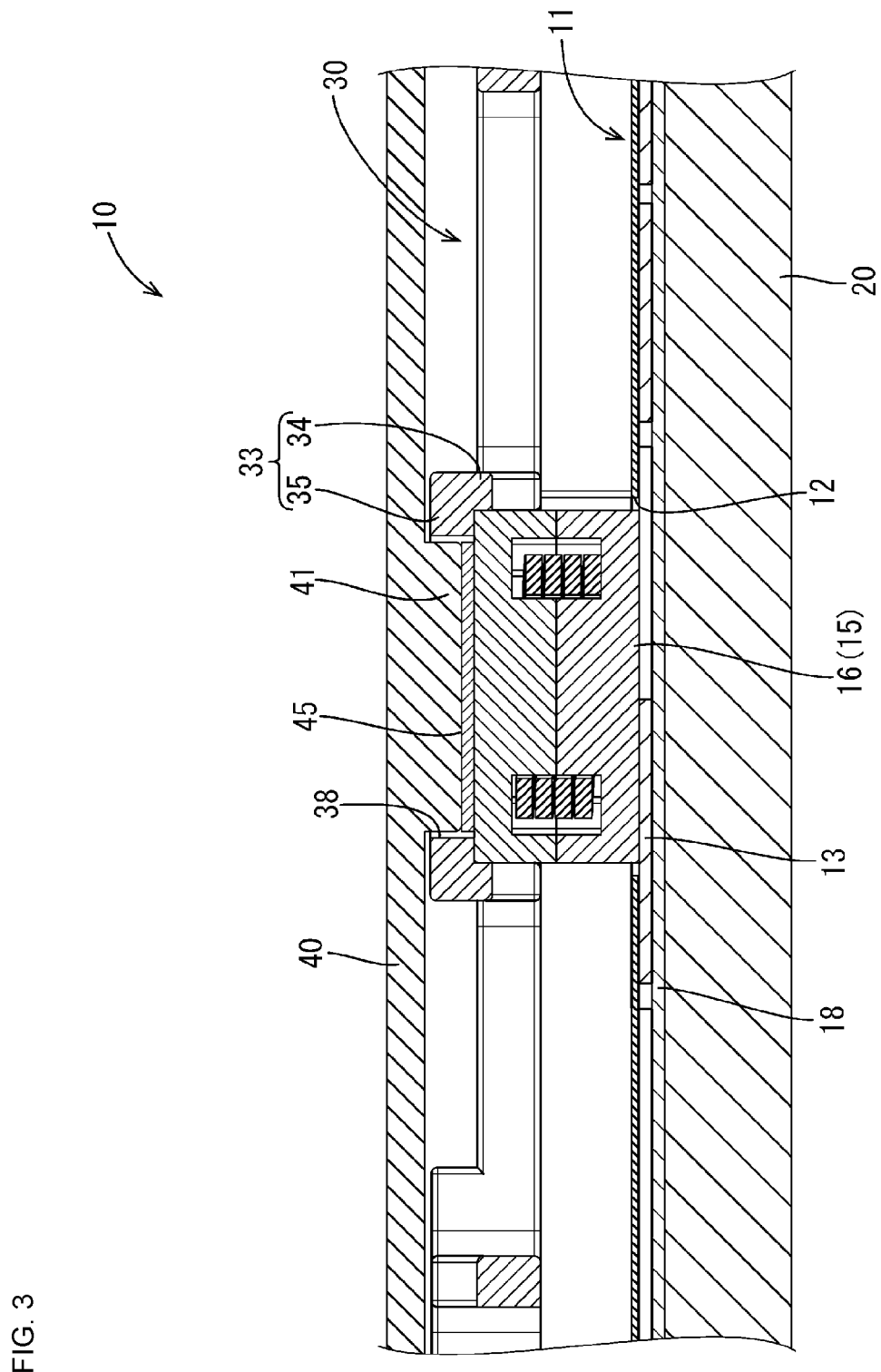
FIG. 3 is a main part enlarged sectional view of the electrical junction box.

As shown in FIG. 3, a contact protrusion 41 protruding toward the main body 16 is provided on the lower surface of the cover portion 40 at a position corresponding to the main body 16 of the coil 15. The contact protrusion 41 has a size that is slightly smaller than the opening size on the inner side of the edge covering portion 35 of the coil holding portion 33 described above. Also, in a state where the upper case (not shown) is assembled at a predetermined position, the protruding length of the contact protrusion 41 from the lower surface of the cover portion 40 is set such that its end portion (its lower surface) presses against a heat transfer sheet 45 (an example of a heat transfer member) disposed on the upper surface of the main body 16 of the coil 15.

As described above, in the present embodiment, the heat transfer sheet 45 is provided on the upper surface of the main body 16 of the coil 15. The heat transfer sheet 45 is made of a flexible elastic material, and is set to a size and thickness that can be accommodated in the opening region continuously surrounded by the edge covering portion 35 of the coil holding portion 33. That is to say, the opening region on the inner side of the edge covering portion 35 of the coil holding portion 33 is a heat transfer sheet holding portion 38 (a heat transfer member holding portion) for positioning and holding the heat transfer sheet 45.

In a state where the upper case is assembled at the predetermined position, the contact protrusion 41 of the cover portion 40 is disposed in the heat transfer sheet holding portion 38, and is set to thermally contact the main body 16 of the coil 15 via the heat transfer sheet 45.

Manufacturing Method of Electrical Junction Box 10

The electrical junction box 10 of the present embodiment has the above-described configuration. Next, an assembling method of the electrical junction box 10 will be described. First, the plurality of bus bars 13 are arranged and adhered in a predetermined pattern on the back surface of a printed circuit board, on which a conductive circuit (not shown) is printed on the mounting surface 11A side by printed wiring technology.

Next, small electronic components (not shown) are disposed at predetermined positions on the mounting surface 11A of the circuit board 11, and are connected to the conductive circuit by soldering. Also, the coils 15 are disposed at predetermined positions (in the connection openings 12) of the circuit board 11. The pair of the connection terminals 17 of each coil 15 is connected to the exposed bus bar 13 by soldering. Then, the circuit board 11 on which the electronic components are mounted is overlaid at a predetermined position on the upper surface of the heat sink 20 via the adhesive insulating sheet 18, and fixed.

Next, the frame 30 is attached to the heat sink 20 at a predetermined position. Specifically, the frame 30 is brought into a predetermined direction and brought close to the heat sink 20, and a part of the frame 30 is fitted into the receiving recess 21 of the heat sink 20. As a result, the frame 30 is disposed at a predetermined position with respect to the heat sink 20, that is, the frame 30 is disposed at a predetermined position with respect to the circuit board 11 positioned on the heat sink 20.

In the state where the frame 30 is disposed on the predetermined position with respect to the circuit board 11, each coil 15 on the circuit board 11 is held by the coil holding portion 33 provided on the frame 30. Specifically, the upper end around the main body 16 of the coil 15 is fitted into the circumferential wall 34 of the coil holding portion 33, and the upper surface of the coil 15 is covered by the edge covering portion 35 of the coil holding portion 33. That is to say, the corners of the upper end of the coil 15 are positioned and held by the coil holding portion 33. In this manner, the main body 16 of the coil 15 is stably held with respect to the circuit board 11.

At this time, the upper surface of the coil 15 is exposed from the opening surrounded by the edge covering portion 35. As mentioned above, the opening region on the inner side of the edge covering portion 35 is the heat transfer sheet holding portion 38. Accordingly, the heat transfer sheet 45 is accommodated in the heat transfer sheet holding portion 38. That is to say, the heat transfer sheet 45 is placed in a predetermined region of the upper surface of the main body 16 of the coil 15.

Next, the upper case is attached to cover the circuit board 11 from above. As shown in FIG. 3, in the state where the upper case is fixed to the predetermined position, the contact protrusion 41 formed on the cover portion 40 of the upper case is disposed in the heat transfer sheet holding portion 38, and contacts and presses the upper surface of the heat transfer sheet 45. In this manner, the electrical junction box 10 is completed.

Operations and Effects of the Present Embodiment

According to the electrical junction box 10 of the present embodiment, the frame 30 includes a heat transfer sheet holding portion 38 that holds the heat transfer sheet 45 at a position where the heat transfer sheet 45 is in heat conductive contact with both the main body 16 of the coil 15 and the cover portion 40. Accordingly, the heat transfer sheet 45 is positioned and held in a predetermined region. That is to say, it is possible to prevent the heat transfer sheet 45 from shifting and moving away from the predetermined position due to vibration or the like of the vehicle. Therefore, heat generated in the coil 15 can be reliably dissipated from the cover portion 40 through the heat transfer sheet 45.

The heat transfer sheet holding portion 38 is an opening region continuously surrounding the heat transfer sheet 45 by the edge covering portion 36. Accordingly, even when a heat conductive adhesive, a heat conductive gel, or the like having a relatively low viscosity is used instead of the heat transfer sheet 45, it is possible to prevent these heat transfer members from flowing out of the heat transfer sheet holding portion 38 (the heat transfer member holding portion).

The frame 30 includes the coil holding portion 33 for holding the main body 16 of the coil 15. Accordingly, it is possible to prevent the coils 15 from shifting due to vibration generated while a vehicle is running. Also, the heat transfer sheet holding portion 38 is provided integrally with the coil holding portion 33. Accordingly, the configuration of the frame 30 can be simplified as compared with a configuration in which the heat transfer sheet holding portion 38 and the coil holding portion 33 are provided separately.

The cover portion 40 is provided with the contact protrusion 41 that protrudes toward the main body 16 and contacts the heat transfer sheet 45. Accordingly, a part of the cover portion 40 (the contact protrusion 41) can be more reliably brought into contact with the heat transfer sheet 45. Also, the contact protrusion 41 is disposed in the heat transfer sheet holding portion 38. Accordingly, the relative positional shifting between the contact protrusion 41 and the heat transfer sheet 45 can be prevented, and an electrical junction box 10 having more excellent heat dissipation can be obtained.

Furthermore, the heat sink 20 is provided on the surface of the circuit board 11 opposite to the mounting surface 11A, and the frame 30 and the cover portion 40 are made of metal. Accordingly, the heat generated in the coils 15 and the circuit board 11 can be dissipated to the outside more efficiently, and an electrical junction box 10 having a high heat dissipation effect can be obtained.

Other Embodiments

The technique disclosed in the present specification is not limited to the embodiment described above with reference to the drawings, and, for example, the following embodiments are also included in the technical scope.

In the above embodiment, the coil 15 was illustrated as an electronic component. However, the electronic component is not limited to a coil. Also, the form of the coil is not limited to the above embodiment. An embedded coil may also be used in which the connection terminals protrude straight from the lower surface of the main body, for example.

In the above embodiment, the coil 15 is connected to the bus bar 13 provided on the back surface of the circuit board 11 through the connection opening 12. However, the coil 15 may also be connected to the conductive circuit provided on the mounting surface 11A side.

In the above embodiment, as a heat transfer member, the heat transfer sheet 45 is disposed between the main body 16 of the coil 15 and the cover portion 40. However, the heat transfer member is not limited to the heat transfer sheet 45. Other types of heat transfer members such as rubber, adhesive, gluing agent, gel, or the like may also be disposed.

In the above embodiment, an example was shown in which the heat transfer sheet holding portion 38 and the coil holding portion 33 are integrally formed. However, the heat transfer sheet holding portion 38 and the coil holding portion 33 may also be formed separately.

In the above embodiment, the coil holding portion 33 is constituted by the circumferential wall 34 and the edge covering portion 35. However, the edge covering portion 35 may also be omitted. In that case, the heat transfer member holding portion can be formed by extending a wall from the circumferential wall (the holding wall) toward the cover portion side.

In the above embodiment, the heat transfer sheet holding portion 38 is continuously surrounded by the edge covering portion 35. However, in a case where the heat transfer member is in the form of a sheet or plate in which its shape is not easily deformed, the heat transfer sheet holding portion 38 may also be formed by intermittent walls. It is sufficient that the heat transfer member can be positioned and held.

Similarly, the circumferential wall 34 (the holding wall) of the coil holding portion 33 (the electronic component holding portion) does not have to be continuous, as long as the coil 15 is positioned and held.

In the above embodiment, the heat sink 20, the frame 30, the upper case (the cover portion 40) are all made of metal. However, part or all of them may also be made of synthetic resin.

In the above embodiment, the circuit board 11 and the heat sink 20 are fixed by the insulating sheet 18 having an insulating property. However, for example, the circuit board 11 and the heat sink 20 may also be bonded by an insulating adhesive, or may also be fixed by screwing.

In the above embodiment, the cover portion 40 is a part of the upper case. However, the cover portion is not limited to this configuration. In a multistage electrical junction box including a plurality of circuit boards, for example, a heat spreader board provided between a circuit board and its upper stage circuit board can be applied as a cover portion.

In the above embodiment, the contact protrusion 41 is provided on the cover portion 40. However, the contact protrusion 41 may also be omitted. In that case, the main body and the cover portion can be brought into heat transfer contact reliably, by protruding the heat transfer member to the cover portion side more than the heat transfer member holding portion, for example.

In the above embodiment, the contact protrusion 41 is disposed in the heat transfer sheet holding portion 38. However, if the heat transfer member is disposed to protrude from the heat transfer member holding portion to the cover portion side, the contact protrusion may also be disposed outside the heat transfer member holding portion.

In the above embodiment, the surface of the cover portion 40 opposite to the surface on which the contact protrusion 41 is provided is exemplified as the flat surface. However, for example, the contact protrusion may also be formed by bending a plate member constituting the cover portion 40.

One contact protrusion may not be provided for one electronic component. One contact protrusion may also be in contact with a plurality of electronic components.

The invention claimed is:

1. An electrical junction box comprising:
    a circuit board on which an electronic component having a main body is mounted on a mounting surface;
    a frame inside of which the circuit board is accommodated;
    a cover portion covering the circuit board from the mounting surface side;
    a heat transfer member disposed between the main body and the cover portion, wherein the frame includes a heat transfer member holding portion holding the heat transfer member at a position where the heat transfer member is in heat conductive contact with both the main body and the cover portion, and
    wherein the frame includes an electronic component holding portion holding the main body, and the heat transfer member holding portion is integrally provided with the electronic component holding portion, the electronic component holding portion having a holding wall and an edge covering portion orthogonal to the holding wall, the holding wall bounding a circumference of the main body and the edge covering portion covering an edge portion of the surface of the main body disposed on the cover portion side, a region surrounded by the edge covering portion serving as the heat transfer member holding portion.

2. The electrical junction box according to claim 1, wherein the heat transfer member holding portion is an opening region continuously surrounding the circumference of the heat transfer member.

3. The electrical junction box according to claim 1, wherein the heat transfer member holding portion extends from the holding wall toward the cover portion side.

4. The electrical junction box according to claim 1, wherein the cover portion is provided with a contact protrusion that protrudes toward the main body and is in contact with the heat transfer member, and the contact protrusion is disposed in the heat transfer member holding portion.

5. The electrical junction box according to claim 1, wherein a heat dissipation plate is provided on the surface of the circuit board opposite to the mounting surface.

6. The electrical junction box according to claim 1, wherein the frame is made of metal.

7. The electrical junction box according to claim 1, wherein the cover portion is made of metal.

* * * * *